United States Patent [19]

Mills et al.

[11] Patent Number: 5,497,355
[45] Date of Patent: Mar. 5, 1996

[54] SYNCHRONOUS ADDRESS LATCHING FOR MEMORY ARRAYS

[75] Inventors: Duane R. Mills; Richard Fackenthal, both of Folsom; Rod Rozman, Placerville; Mamun Rashid, Fairfield, all of Calif.

[73] Assignee: Intel Corporation, Santa Clara, Calif.

[21] Appl. No.: 253,842

[22] Filed: Jun. 3, 1994

[51] Int. Cl.$^6$ ..................................................... G11C 8/00
[52] U.S. Cl. ........................ 365/230.08; 365/230.02; 365/230.03; 365/230.04; 365/233
[58] Field of Search .................... 365/230.08, 230.04, 365/233, 230.03, 230.01, 230.02

[56] References Cited

U.S. PATENT DOCUMENTS

| | | | |
|---|---|---|---|
| 4,785,428 | 11/1988 | Bajawa et al. | 365/233 |
| 5,261,064 | 11/1993 | Wyland | 365/230.08 X |
| 5,297,148 | 3/1994 | Harari et al. | 371/10.2 |
| 5,302,866 | 4/1994 | Chiang et al. | 307/465 |
| 5,306,963 | 4/1994 | Leak et al. | 307/443 |
| 5,331,601 | 7/1994 | Parris | 365/230.08 |
| 5,404,338 | 4/1995 | Murai et al. | 365/233 |

FOREIGN PATENT DOCUMENTS 251324  1/1992  United Kingdom .

OTHER PUBLICATIONS

Dipert, Brian. Flash Memory vol. II: "Flash Memory: Meeting The Needs Of Mobile Computing" AR–715. pp. 10–8 thru 10–15, Intel Corporation, Mt. Prospect, IL. 1992.
Dipert, Brian. Mobile Computer Products: "28F008SA Hardware Interfacing" AP 359, pp. 4–299 thru 4–309, Intel Corporation, Mt. Prospect, IL. Aug., 1992.
"Memory in the fast lane", Betty Prince, IEEE Spectrum, Feb., 1994, pp. 38–41. Order No. 0018–9235/94.
Dipert, Brian & Levy, Markus. "Designing with Flash Memory, The definitive guide to designing flash memory hardware and software for components and PCMCIA cards." Chapter Five: Hardware Interfacing To Flash Memory Components. Annabooks, San Diego, California, Oct., 1993, pp. 73–104.
Flash Memory: vol. I: "Flash Memory Overview", Intel Corporation, Mt. Prospect, IL. Nov. 1992. pp. 2–1 to 2–6. Order No. 296101–004.
Sama, Anil & Dipert, Brian. Flash Memory: vol. I: "Power Supply Solutions For Flash Memory" AP–357. Intel Corporation, Mt. Prospect, IL. Sep. 1993.
Verner, Don. Flash Memory: vol. I: "Implementing Mobile PC Designs Using High Density FlashFile Components" AP–362. Intel Corporation, Mt. Prospect, IL. Oct., 1993.

*Primary Examiner*—David C. Nelms
*Assistant Examiner*—Huan Hoang
*Attorney, Agent, or Firm*—Blakely, Sokoloff, Taylor & Zafman

[57] ABSTRACT

Synchronous address latching circuitry for a memory device having at least first and second banks of memory arrays is described. The latching circuitry has first and second master latches to receive and store an external address. A first slave latch is also included to receive and store the external address from the first master latch if the external address belongs to the first bank and to provide the external address as a first address to the first bank. A second slave latch is included to receive and store the external address from the second master latch if the external address belongs to the second bank and to provide the external address as a second address to the second bank.

22 Claims, 5 Drawing Sheets

SYNCHRONOUS ADDRESS LATCHING FOR MEMORY ARRAYS

FIELD OF THE INVENTION

The present invention pertains to the field of computer systems. More particularly, the present invention relates to addressing memory locations within computer systems.

BACKGROUND OF THE INVENTION

Typically, the heart of a personal computer system is a central processing unit (CPU) that resides on a microprocessor chip. New microprocessor chips that operate at increasingly high operating speeds are constantly being developed in order to permit personal computers to execute large programs and process large data files in a timely manner.

If the next instruction to be executed is not available when the microprocessor needs it, then the microprocessor typically must wait idly (i.e. insert wait cycles) while the required instruction is retrieved and provided to the microprocessor. Furthermore, if the next instruction to be executed requires data that is not immediately available to the microprocessor, the microprocessor must also idle until the data has been retrieved. Therefore, many modern high performance microprocessors have an internal cache. Instructions that are likely to be executed, and data that are likely to be needed by the executing instructions, are stored in the internal cache so that they may be accessed immediately by the CPU of the microprocessor.

Because the internal cache is typically filled a cache line at a time, many microprocessors can accept data in a burst mode. In a typical burst read, the microprocessor specifies the addresses of the data or instructions to be read into a cache line. Then, the data or instructions that are stored at the specified addresses are sent from where they are stored within the computer system to the microprocessor. Alternately, the microprocessor specifies a single address of the cache line, then the addresses of the rest of the cache line are calculated and the data at these locations are sent to the microprocessor.

Typically, an address is specified as a single monolithic address and each bit of the address is specified on its own address bit line. An address valid signal is provided with the address to signify that a valid address is being asserted on the address lines. Alternately, the number of address lines can be reduced by dividing an address into parts and then multiplexing the address parts on the address lines. For example, a single address can map into a row and column address pair. The row and column addresses then share the same set of address lines. Typically, row and column address strobe signals are provided to indicate respectively when a valid row or column address is placed on the shared address lines.

A high speed microprocessor chip typically interfaces with the rest of the computer system using at least one high speed bus to access fast (low latency) devices. Examples of devices that typically are coupled to the high speed bus include the main memory of the computer system and an external memory cache.

A computer system also typically has a relatively low speed bus to access slow (high latency) devices. Some microprocessor can interface directly with the low speed bus. Alternately, the low speed bus is coupled to the high speed bus using a bus bridge. One type of device that is typically coupled to the low speed bus uses flash memory. Flash memory typically is a high-density, nonvolatile, read-write memory. Examples of flash memory based devices include BIOS ROM and hard disk substitutes. The read operation associated with a typical flash memory array closely resembles the read operation associated with other read-only memory devices. Write and erase operations for a flash memory array are, however, significantly slower than the read operation.

British patent document no. GB 2 251 324 A, published Jul. 1, 1992, describes a computer system that uses flash memory. The patent document discloses various architectures to incorporate a flash memory into a computer system. One architecture referred to therein is a variable file structure. For the variable file structure, computer code is stored contiguously in flash memory, allowing a CPU to execute computer code directly from the flash memory array without the need for RAM.

Thus, flash memory can serve as the main memory within computers, providing user functions similar to those of disk-based systems. For example, by storing application software and operating system code in a Resident Flash Array (RFA), users enjoy virtually instant-on performance and in-place code execution. An RFA also protects against software obsolescence because, unlike ROM, it is in-system updatable. Resident software, stored in flash rather than disk, extends battery life and increases system reliability. File management software such as Microsoft's Flash File System (FFS) allows flash memory components and flash cards to emulate the file storage capabilities of disk thereby making the management of flash memory devices completely transparent to the user.

Flash memory, however, typically has an asynchronous interface wherein an address to be read is specified and then, a set time later, the contents stored at the specified address are output from the flash chip. It is only after the data has been output from the flash chip that the next address to be read can be sent to the flash chip. A high speed bus can run at 33 MHz wherein every cycle of the bus takes about 30 nanoseconds (nS). A typical high speed flash chip, on the other hand, has a read access time of about 80 nS. Hence, if flash memory is to be used as main memory, every single memory access to flash involves wait states and zero wait state back to back burst cycles from flash cannot be supported. This is true for other devices having a read latency similar to that of flash memory. Thus, using prior art technology, it is not practical to use these memories as main memory for a high speed microprocessor.

SUMMARY AND OBJECTS OF THE INVENTION

Therefore, one object of the present invention is to provide an efficient memory hierarchy based on non-volatile memory versus volatile memory wherein both data and applications are stored in random access nonvolatile memory and further wherein applications are executed directly from the random access non-volatile memory.

It is also an object of this invention to enable flash memory to operate in an optimal synchronous fashion with a synchronous bus so that the CPU can execute programs directly out of the flash memory without any degradation in performance when compared to volatile memory based main memory.

It is also an object of this invention is to enable flash memory to operate in an optimal synchronous fashion with a synchronous bus and to thereby eliminate the need to incorporate costly memory subsystem designs such as interleaving into the system.

It is also an object of this invention to enable flash memory to operate in an optimal synchronous fashion with any synchronous bus and to thereby support back to back burst cycles and thus ensure that cache line fills are performed in a quick and optimal fashion.

Synchronous address latching circuitry for a memory device having at least first and second banks of memory arrays is described. The latching circuitry has first and second master latches to receive and store an external address. A first slave latch is also included to receive and store the external address from the first master latch if the external address belongs to the first bank and to provide the external address as a first address to the first bank. A second slave latch is included to receive and store the external address from the second master latch if the external address belongs to the second bank and to provide the external address as a second address to the second bank.

Other objects, features, and advantages of the present invention will be apparent from the accompanying drawings and from the detailed description which follows below.

BRIEF DESCRIPTION OF THE DRAWINGS

The present invention is illustrated by way of example and not limitation in the figures of the accompanying drawings, in which like references indicate similar elements, and in which.

DETAILED DESCRIPTION

Figure 1:
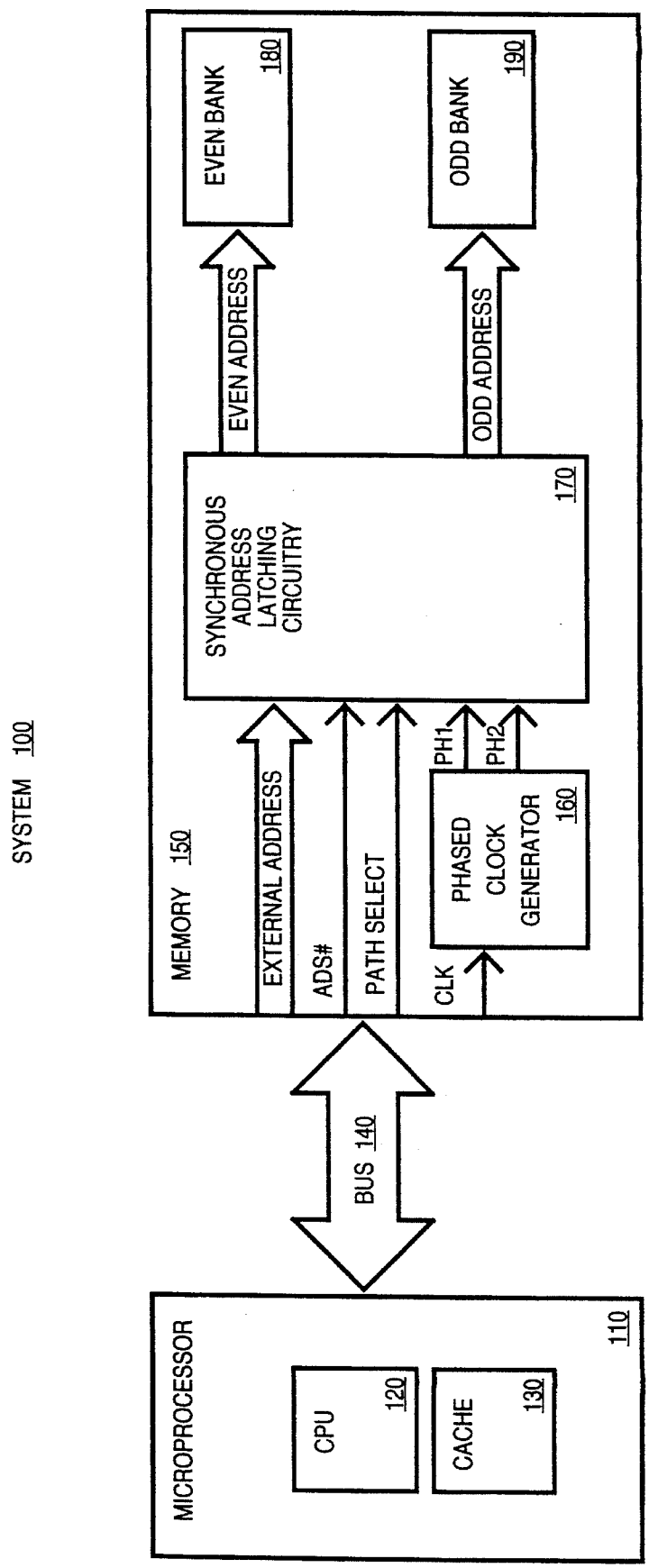
FIG. 1 illustrates a computer system having a microprocessor that is coupled by a high speed bus to a flash memory having synchronous address latching circuitry.

FIG. 1 illustrates a computer system 100 wherein microprocessor 110 is coupled to memory 150 by high speed bus 140. Microprocessor 110 includes central processing unit (CPU) 120 and cache 130. Cache 130 stores frequently used data and instructions so that they can be accessed by CPU 120. Microprocessor 110 has a burst read mode, wherein bus 140 is used to retrieve bursts of data or instructions from memory 150 to fill one or more cache lines of cache 130. Alternately, microprocessor 110 has a burst write mode, wherein bus 140 is used to send bursts of data or instructions from one or more cache lines of cache 130 to be stored in memory 150. The operation of microprocessors and burst accesses across high speed buses is well understood in the art and will not be described further except as they relate to the operation of synchronous addressing circuitry 170 of memory 150.

Alternately, microprocessor 110 can be replaced by any device that performs burst accesses to memory 150. Examples of such devices include external cache memories and direct memory access (DMA) devices.

Memory 150 has been divided into two banks of memory, even bank 180 and odd bank 190. Although banks 180 and 190 are part of the same integrated circuit, they are isolated to the extent that each bank can be accessed while the other bank is also being accessed. Synchronous address latching circuitry 170 receives external addresses representing memory locations to be accessed from banks 180 and 190. If the external address is an even address, synchronous address latching circuitry 170 dispatches the even address to even bank 180 to initiate an access to the memory location associated with the dispatched even address. If, on the other hand, the external address is an odd address, synchronous address latching circuitry dispatches the odd address to odd bank 190 to initiate an access to the memory location associated with the dispatched odd address.

For an embodiment wherein external addresses are binary integers, synchronous address latching circuitry 170 will identify even or odd addresses based on the least significant bit of the external address. Thus, an external address having a least significant bit that has the value of zero, will be deemed an even address and dispatched to even bank 180. On the other hand, an external address having a least significant bit that has the value of one, will be deemed an odd address and dispatched to odd bank 180. Note that because the least significant bit of the external address is used to select between the even and odd banks, the information contained within the least significant bit of the external address is implicit within even and odd addresses. Therefore, the even and odd addresses can be expressed using one less bit than is required to express the external address.

Throughout this description the conventions "odd" and "even" will be used to describe banks 180 and 190, respectively, and to describe how synchronous address latching circuitry 170 discriminates between addresses for bank 180 and addresses for bank 190. It is to be understood, however, that alternate conventions and bank determination algorithms can be employed by synchronous address latching circuitry 170. For example, for an embodiment wherein synchronous address latching circuitry 170 discriminates between banks using the most significant bit of the external address, then a "high" and "low" address naming convention would be more appropriate than that of "even" and "odd". In such a case, rather than even and odd addresses being used to access even and odd banks, high and low addresses would be used to access high and low banks.

Moreover, memory 150 can be separated into more than two banks. If four banks were used, the banks could simply be named banks one through four. In one embodiment, the two least significant bits of the external address could be used to determine which of the four banks contains the location to be accessed as specified by a particular external address. Alternately, two or more non-contiguous bits of the external address can be used to identify the bank to be accessed. Thus, for example, the most and least significant bits of the external address can be combined and used to select among high-odd, high-even, low-odd and low-even banks.

For the embodiment depicted in FIG. 1, each external address is provided to memory 150 from bus 140 accompanied by an address strobe ADS# signal on the rising edge of a pulse from clock signal CLK. Alternately, a single address is provided to memory 150 and based upon this address, a counter circuit internal to memory 150 calculates the succeeding addresses of a data burst. These succeeding addresses are then provided synchronous address latching circuitry one at a time on successive clock pulses from clock signal CLK.

With this architecture, it is possible for the user to interleave accesses between the even bank 180 and odd bank 190. An access request for even bank 180 can be followed immediately on the next pulse of clock signal CLK by an access request to odd bank 190. As long as address setup and hold times are met, the two accesses will occur in parallel (staggered in time). Therefore, as long as access requests alternate between even bank 180 and odd bank 190, a throughput of almost twice that of the non-interleaved part may be achieved. The maximum frequency at which interleaving can be sustained is a function of the array access time per bank and the number of banks.

This access is a synchronous access because clock signal CLK synchronizes microprocessor 110 and memory 150. This permits memory 150 to remain in synch with microprocessor 110 as far as the phase of the clock is concerned. Thus, whenever the clock of microprocessor 110 goes high, the clock of memory 150 will also go high. That is important because, for example, in a read operation, memory 150 will send the data to be read out to microprocessor 110 when microprocessor 110 expects the data (i.e., the proper number of cycles after the request).

Phased clock generator 160 receives clock signal CLK and generates two phased clock signals, PH1 and PH2. Phased clock signals PH1 and PH2 are then provided to synchronous address latching circuitry 170 and control the latching of addresses by circuitry 170. For one embodiment, signal PH2 is identical to clock signal CLK and signal PH1 is also identical to, but is 180 degrees out of phase from, clock signal CLK. For this embodiment, signals CLK, PH1 and PH2 will have the same frequency. Each rising edge of signal PH2 will coincide with a rising edge of signal CLK and each falling edge of signal PH2 will coincide with a falling edge of signal CLK. Because signal PH1 is 180 degrees out of phase from signal CLK, each rising edge of signal PH1 will coincide with a falling edge of signal CLK and each falling edge of signal PH1 will coincide with a rising edge of signal CLK. Alternately, phased clock signals PH1 and PH2 are generated by phased clock generator 160 independently from external clock signal CLK.

Signal PATH SELECT is also provided to synchronous address latching circuitry 170 to enable or disable the synchronous address latching functionality of circuitry 170. Thus, by asserting or not asserting signal PATH SELECT, one can control whether or not memory 150 will accept addresses synchronously for a burst access. When the synchronous address latching functionality of circuitry 170 is disabled, memory 150 will operate asynchronously such that the access associated with an external address provided to memory 150 must complete before a next external address can be provided to memory 150 and its associated access begun. Therefore, this architecture also supports backward compatibility with previous flash products by offering an asynchronous address path to be used in an asynchronous mode that for one embodiment can be set by a factory-programmable option. The asynchronous address path bypasses most of the circuitry in the synchronous path thereby preventing the synchronous hardware from impeding the performance of the asynchronous option.

For one embodiment, signal PATH SELECT is provided externally to memory 150. Alternately, the PATH SELECT signal is generated or not depending upon a software flag within memory 150. Thus, for example, the PATH SELECT signal is generated or not depending upon whether or not a bit within a register or content addressable memory cell within memory 150 is set. For yet another embodiment, the PATH SELECT signal is generated or not depending upon a hardware setting within memory 150. Thus, for example, the PATH SELECT signal is generated or not depending upon whether or not laser zappable fuse has been blown or a top metal bond connection is open or closed. For yet another embodiment, there is no PATH SELECT signal and the synchronous address latching functionality of circuitry 170 cannot be disabled.

For one embodiment of computer system 100, memory 150 is flash memory that is being used to replace some, if not all, of volatile main memory (not shown). Thus, flash memory 150 is used in lieu of volatile main memory such as dynamic random access memory (DRAM) or static random access memory (SRAM) to provide a high speed non-volatile main memory for computer system 100.

Alternately, memory 150 is not flash memory, but another kind of memory that is to be accessed by microprocessor 110 using burst accesses, but that cannot support back-to-back burst cycles (e.g. read-only memory (ROM), programmable ROM (PROM), erasable PROM (EPROM), electrically erasable PROM (EEPROM)).

Figure 2:
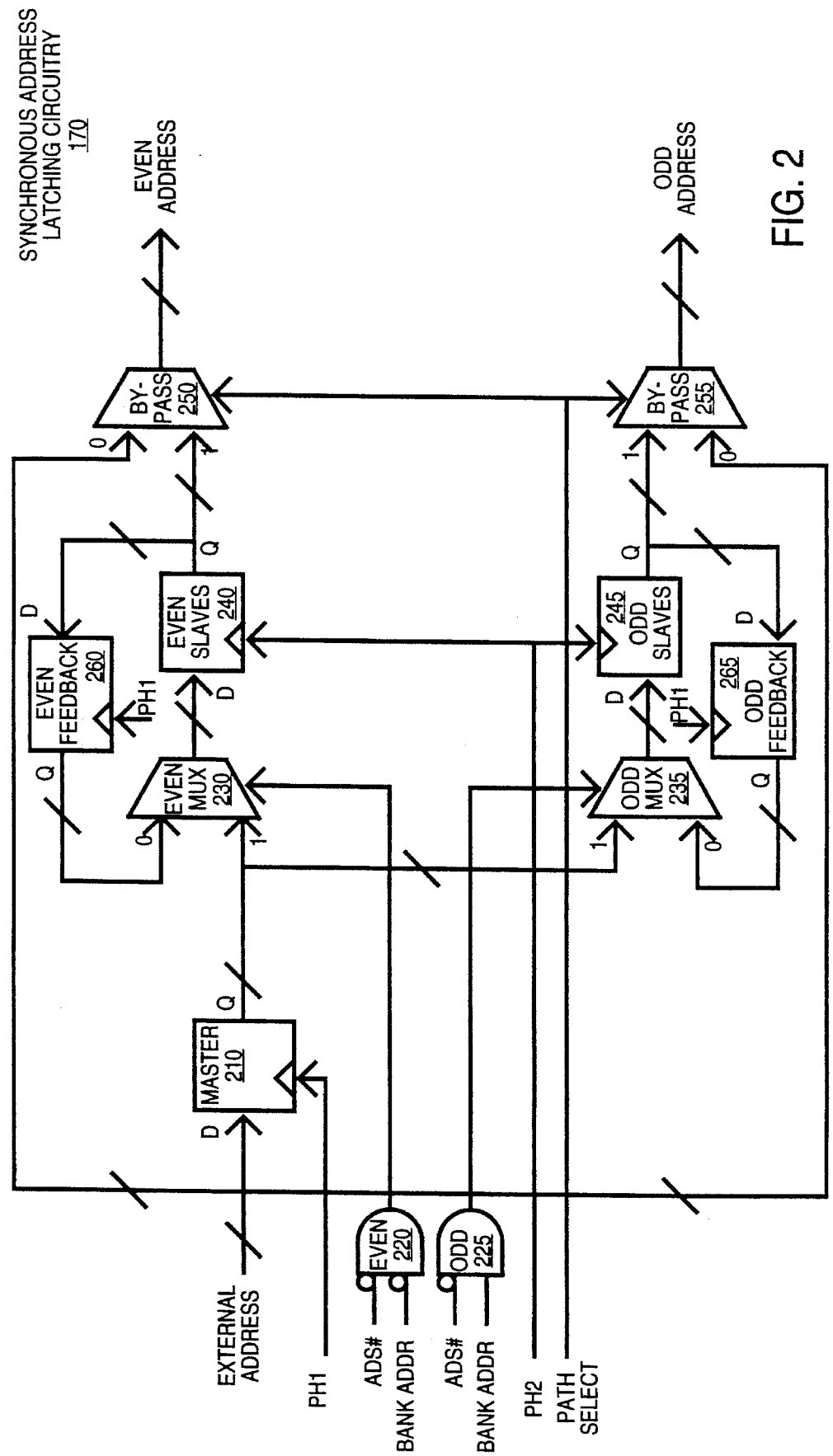
FIG. 2 illustrates an embodiment of the synchronous address latching circuitry of FIG. 1.

FIG. 2 illustrates an embodiment of the synchronous address latching circuit of FIG. 1. For the embodiment of synchronous address latching circuitry 170 illustrated in FIG. 2, circuitry 170 consists of master-slave address latches, logic to decode a bank address and present the odd or even address to the array decoders of the appropriate bank, and logic to select between the synchronous and asynchronous paths. The latches are controlled by a two-phase non-overlapping clocking scheme, using phased clocks PH1 and PH2.

Inside the synchronous path, there is one set of master latches 210 with one master latch per address line. Each master latch of the set of master latches 210 is clocked by PH1. The number of address lines depends upon how many address bits are required for the configuration (i.e. how many bits there are in the external address). For one embodiment, there are twenty address bits in an external address (and hence twenty address lines). For each address line, there are two sets of slave latches, odd slave latches 245 for the odd bank and even slave latches 240 for the even bank. Both odd slave latches 245 and even slave latches 240 are sets of slave latches with one slave latch for each address line. The slave latches of odd slave latches 245 and of even slave latches 240 are all clocked by PH2.

As described previously, the system clock CLK is run into a phase generator and divided to make phase 1 clock PH1 and phase 2 clock PH2. In FIG. 2, every external address provided to synchronous address latching circuitry 170 is clocked into multi-bit master flip flop 210 under the control of PH1. The multi-bit output of master flip flop 210 is provided as one of two inputs to multi-bit even select multiplexer 230 and also is provided as one of two inputs to multi-bit odd select multiplexer 235.

The address strobe signal ADS# is a signal that indicates when a valid external address is being provided to master flip flop 210. The complement of signal ADS# is provided as one input to a pair of two input AND gates (i.e. even AND gate 220 and odd AND gate 225).

The output signal from even AND gate 220 controls even multiplexer (MUX) 230. Even MUX 230, in turn, is a multi-bit 2:1 multiplexer that provides the inputs to even slave latches 240 depending upon the value of the output signal from even AND gate 220. One set of inputs to even MUX 230 (and hence to even slaves 240) is the set of outputs from master latches 210. The other set of inputs to even MUX 230 is the set of outputs from multi-bit even feedback latches 260. The set of inputs to even feedback latches 260 is the set of outputs from even slave latches 240. Although even slave latches 240 are controlled by clock PH2, master slave latches 210 and even feedback latches 260 are controlled by clock PH1.

Similarly, the output signal from odd AND gate 225 controls odd multiplexer (MUX) 235. Odd MUX 235, in turn, is a multi-bit 2:1 multiplexer that provides the inputs to odd slave latches 245 depending upon the value of the output signal from odd AND gate 225. One set of inputs to odd MUX 235 (and hence to odd slaves 240) is the output of master latches 210. The other set of inputs to odd MUX 235 is the set of outputs from multi-bit odd feedback latches 265. The set of inputs to odd feedback latches 265 is the set of outputs from odd slave latches 245. Although odd slave latches 245 are controlled by clock PH2, master slave latches 210 and odd feedback latches 265 are controlled by clock PH1.

The bank address signal BANK ADDR is formed from the external address. In the case where there are odd and even banks, the signal BANK ADDR has the same value as the least significant bit of the external address. In the case where there are high and low banks, the signal BANK ADDR has the same value as the most significant bit of the external address.

The signal BANK ADDR is provided as the other input to odd AND gate 225 and the complement of the signal BANK ADDR is provided as the other input to even AND gate 220. When ADS# is triggered, then one, but not both, of AND gates 225 and 220 will have an output to multiplexer 235 or 230 that selects the (odd 245 or even 240) slave latches that will accept the entire external address.

Thus, when the user wishes to access the memory array, address strobe signal ADS# is brought low some setup time before the rising edge of the external clock signal CLK (which is the same as phased clock PH2). This, along with the appropriate value on the BANK ADDR signal line, will cause the BANK ADDR decode logic to cause the appropriate slave latches (odd slave 245 or even slave 240) to accept a new address from the user, by controlling the appropriate pre-slave 2:1 multiplexer (even mux 230 or odd mux 235). Otherwise, odd slaves 245 and even slaves 240 will retain their previous addresses by way of the PH1 docked feedback latches (odd feedback 265 and even feedback 260) that form feedback paths.

The way that the address latches work is that every time a clock pulse goes to the address latches, the latches open and send a new address through them. If the current access is to an odd bank, then one wants to ensure that the even bank retains its most recent even address. Therefore there is a feed-back loop to feed back the old address. That way, if the access is actually to the odd bank, even slaves 240 will pass through the same address that they already had. Therefore, there will be no change in the address for the bank that is not being accessed. Thus, if the user orders continuous accesses to odd bank addresses, then the previous even address keeps being latched into even slave latches 240 ensuring that the even address stays the same. As soon as the user flips to a new even address, then, rather than accepting the old even address again from even feedback latches 230, even MUX 230 (controlled by even AND gate 220) changes to accept the new even address from master latches 210. This also causes odd MUX 235 to toggle and cause a feed back to ODD slave latches 245 when the new even bank address is being latched.

Therefore, there is only one access to any bank on any given phase. That is guaranteed by the negation of the BANK ADDR signal. The inputs to AND gates 220 and 225 can never be the same because the negation ensures opposite logical values. Synchronous address latching circuitry 170 is symmetric in that respect, but it is also asymmetric because multiplexers 230 and 235 operate off of opposite polarities.

Multi-bit bypass multiplexers 250 and 255 are controlled by the PATH SELECT signal. When signal PATH SELECT indicates that the synchronous address latching mode is being used, bypass 250 steers the outputs from even slave latches 240 to the address decode circuitry for the even memory bank and bypass 255 steers the outputs from odd slave latches 245 to the address decode circuitry for the odd memory bank. If, however, signal PATH SELECT indicates that the synchronous address latching mode is not being used, bypass 250 steers the external address directly to the address decode circuitry for the even memory bank and bypass 255 steers external address directly to the address decode circuitry for the odd memory bank. Thus, when synchronous address latching mode is not being used, bypass multiplexers 250 and 255 effectively remove the rest of the components of address latching circuitry 170 (and any delay that they would cause) from the address path to the memory banks.

Synchronous address latching circuitry 170 can be extended to cover more than two banks. For example, for an embodiment wherein there are four banks, the bank address signal BANK ADDR would be expanded to be a two bit signal. There would be four sets of slave latches so that there would be one set of slave latches for each bank. Each set of slave latches would have its own input multiplexer and set of feedback latches. The input multiplexer would select between the master latches and the feedback latches under control from a three input AND gate decoder for the associated bank.

Thus, there would be four three input AND gate decoders. One input to each AND gate decoder would be the complement of address strobe signal ADS#. The other two inputs for each AND gate decoder would be the two bits of the bank address signal. For one of the AND gate decoders, both bits of signal BANK ADDR would be provided unchanged as input to the decoder. For the second of the AND gate decoders, both bits of signal BANK ADDR would be complemented before being provided as input to the decoder. For the third of the AND gate decoders, only the high order bit of signal BANK ADDR would be complemented before being provided as input to the decoder and the low order bit would be provided unchanged. For the fourth of the AND gate decoders, only the low order bit of signal BANK ADDR would be complemented before being provided as input to the decoder and the high order bit would be provided unchanged.

Figure 3:
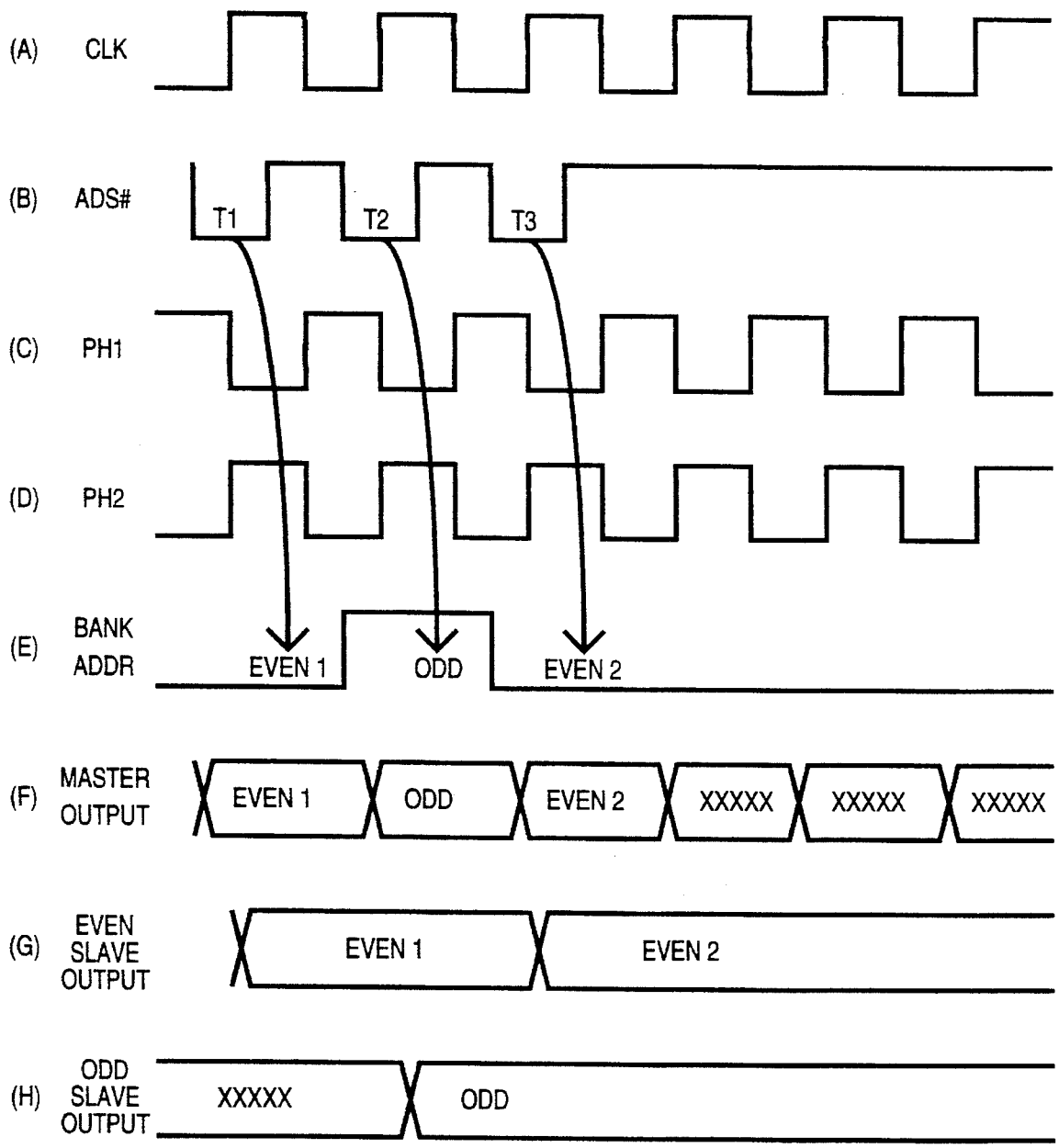
FIG. 3 is a timing diagram that illustrates the operation of the synchronous address latching circuitry of FIG. 2.

FIG. 3 is a timing diagram that illustrates the operation of the synchronous address latching circuitry of FIG. 2. In FIG. 3, one can see the relationship between phased clocks PH1 and PH2 and the external clock CLK from which they were generated. Phased clock PH2 is exactly the same as external clock CLK. Phased clock PH1 is an inversion of PH2. Thus, PH1 and PH2 are 180 degrees out of phase from each other. That is, one has leading edges where the other has trailing edges, and vice versa. PH1 and PH2, however, both have the same frequency as system clock CLK.

FIG. 3 shows the flow of addresses through circuit 170 for a three address burst access sequence. In the three address burst access sequence depicted, an even address (EVEN 1) is followed by an odd address (ODD) and then by a second even address (EVEN 2) on three subsequent clock cycles of clock signal CLK. FIG. 3, however, does not show the output of the data addressed by the three address burst access sequence (assuming that the access is a read). After the first even slave output address, one would wait the access time for the device and then out of the even bank would come the data associated with the address. One clock later (because the address transitioned from even to odd a clock later), one would again wait the access time and then out of the odd bank would come the data associated with the odd address. Similarly, one more clock later, one would again wait the access time and then out of the even bank would come the data associated with the second even address.

In FIG. 3, it can be seen that the first address (EVEN1) is specified when the address strobe signal ADS# is brought low prior to the rising edge at time T1 of the first clock cycle. Because address EVEN 1 is even, the least significant bit will be zero. Therefore, the bank address signal BANK ADDR will be low at time T1 causing the output of the master latches 210 to be steered into even slave latches 240 by even mux 230. Address EVEN 1 will then be output from even slave latches 240 and provided through bypass 250 to the even memory bank and an access will begin.

The second address (ODD) is specified when the address strobe signal ADS# is brought low prior to the rising edge at time T2 of the second clock cycle. Because address ODD is odd, the least significant bit will be one. Therefore, the bank address signal BANK ADDR will be high at time T2 causing the output of the master latches 210 to be steered into odd slave latches 245 by odd mux 235. Address ODD will then be output from odd slave latches 245 and provided through bypass 255 to the odd memory bank and an access will begin. The first address (EVEN1) is specified when the address strobe signal ADS# is brought low prior to the rising edge of the first clock cycle at time T1.

Meanwhile, when the bank address signal BANK ADDR transitioned high it caused the output of even feedback latches 260 to be steered into even slave latches 240 by even mux 230. Therefore, address EVEN 1 will continue to be output from even slave latches 240 and provided through bypass 250 to the even memory bank until the second even address is specified.

The second even address (EVEN 2) is specified when the address strobe signal ADS# is brought low prior to the rising edge at time T3 of the third clock cycle. Because address EVEN 2 is even, the least significant bit will be zero. Therefore, the bank address signal BANK ADDR will be low at time T3 causing the output of the master latches 210 to once again be steered into even slave latches 240 by even mux 230. Address EVEN 2 will then be output from even slave latches 240 and provided through bypass 250 to the even memory bank and another access to the even bank will begin.

Meanwhile, when the bank address signal BANK ADDR transitioned low it caused the output of odd feedback latches 265 to be steered into odd slave latches 245 by odd mux 235. Therefore, address ODD will continue to be output from odd slave latches 245 and provided through bypass 255 to the odd memory bank after the second even address has been specified.

Figure 4:
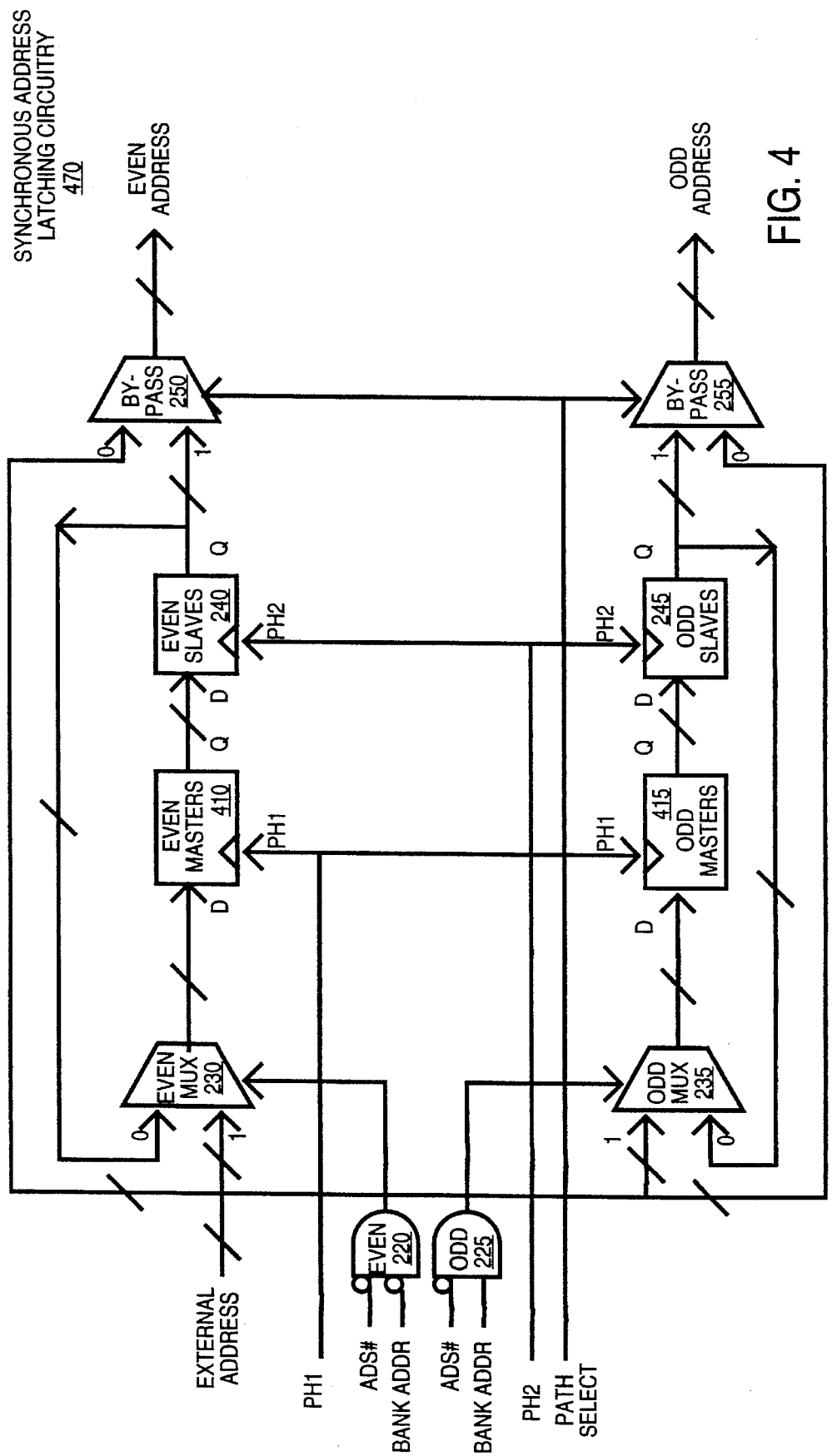
FIG. 4 illustrates a second embodiment of the synchronous address latching circuitry of FIG. 1.

FIG. 4 illustrates a second embodiment of the synchronous address latching circuit of FIG. 1. For the embodiment of synchronous address latching circuitry 470 illustrated in FIG. 4, circuitry 470 consists of pairs of master-slave address latches, logic to decode a bank address and present the odd or even address to the array decoders of the appropriate bank, and logic to select between the synchronous and asynchronous paths. The latches are controlled by a two-phase non-overlapping clocking scheme, using phased clocks PH1 and PH2.

Inside the synchronous path, there two sets of select multiplexers, two sets of master latches and two sets of slave latches. The number of address lines depends upon how many address bits are required for the configuration (i.e. how many bits there are in the external address). For one embodiment, there are twenty address bits in an external address (and hence twenty address lines). For each address line, there are two sets of master latches, odd master latches 415 for the odd bank and even master latches 410 for the even bank. Both odd master latches 415 and even master latches 410 are sets of master latches with one master latch for each address line. The master latches of odd master latches 415 and of even master latches 410 are all clocked by PH1. For each address line, there are also two sets of slave latches, odd slave latches 245 for the odd bank and even slave latches 240 for the even bank. Both odd slave latches 245 and even slave latches 240 are sets of slave latches with one slave latch for each address line. The slave latches of odd slave latches 245 and of even slave latches 240 are all clocked by PH2.

As described previously, the system clock CLK is run into a phase generator and divided to make phase 1 clock PH1 and phase 2 clock PH2. In FIG. 4, every external address provided to synchronous address latching circuitry 470 is clocked into multi-bit master flip flop 410 or is clocked into master flip flop 415 under the control of PH1. The multi-bit external address is provided as one of two inputs to multi-bit even select multiplexer 230 and also is provided as one of two inputs to multi-bit odd select multiplexer 235.

The address strobe signal ADS# is a signal that indicates when a valid external address is being provided to synchronous address latching circuitry 470. The complement of signal ADS# is provided as one input to a pair of two input AND gates (i.e. even AND gate 220 and odd AND gate 225).

The output signal from even AND gate 220 controls even multiplexer (MUX) 230. Even MUX 230, in turn, is a multi-bit 2:1 multiplexer that provides the inputs to even master latches 410 depending upon the value of the output signal from even AND gate 220. One set of inputs to even MUX 230 (and hence to even masters 410) is the external address. The other set of inputs to even MUX 230 is the set of outputs fed back from even slave latches 240. Although even slave latches 240 are controlled by clock PH2, master slave latches 210 are controlled by clock PH1.

Similarly, the output signal from odd AND gate 225 controls odd multiplexer (MUX) 235. Odd MUX 235, in turn, is a multi-bit 2:1 multiplexer that provides the inputs to odd master latches 415 depending upon the value of the output signal from odd AND gate 225. One set of inputs to odd MUX 235 (and hence to odd masters 415) is the external address. The other set of inputs to odd MUX 235 is the set of outputs fed back from odd slave latches 245. Although odd slave latches 245 are controlled by clock PH2, master slave latches 415 are controlled by clock PH1.

The bank address signal BANK ADDR is formed from the external address. In the case where there are odd and even banks, the signal BANK ADDR has the same value as the least significant bit of the external address. In the case where there are high and low banks, the signal BANK ADDR has the same value as the most significant bit of the external address.

The signal BANK ADDR is provided as the other input to odd AND gate 225 and the complement of the signal BANK ADDR is provided as the other input to even AND gate 220. When ADS# is triggered, then one, but not both, of AND gates 225 and 220 will have an output to multiplexer 235 or 230 that selects the (odd 415 or even 410) master latches that will accept the entire external address.

Thus, when the user wishes to access the memory array, address strobe signal ADS# is brought low some setup time before the rising edge of the external clock signal CLK (which is the same as phased clock PH2). This, along with the appropriate value on the BANK ADDR signal line, will cause the BANK ADDR decode logic to cause the appropriate master latches (odd masters 415 or even masters 410) to accept a new address from the user, by controlling the appropriate pre-slave 2:1 multiplexer (even mux 230 or odd mux 235). Otherwise, odd masters 415/slaves 245 and even masters 410/slaves 240 will retain their previous addresses by way of the feedback paths.

The way that the address latches work is that every time a clock pulse goes to the address latches, the latches open and send a new address through them. If the current access is to an odd bank, then one wants to ensure that the even bank retains its most recent even address. Therefore there is a feed-back loop to feed back the old address. That way, if the access is actually to the odd bank, even masters 410 and even slaves 240 will pass through the same address that they already had. Therefore, there will be no change in the address for the bank that is not being accessed. Thus, if the user orders continuous accesses to odd bank addresses, then the previous even address keeps being latched into even master latches 410 and slave latches 240 ensuring that the even address stays the same. As soon as the user flips to a new even address, then, rather than accepting the old even address again fed back from even slave latches 240, even MUX 230 (controlled by even AND gate 220) changes to accept the new even address as input to master latches 410. This also causes odd MUX 235 to toggle and cause a feed back to odd master latches 415 and odd slave latches 245 when the new even bank address is being latched.

Therefore, there is only one access to any bank on any given phase. That is guaranteed by the negation of the BANK ADDR signal. The inputs to AND gates 220 and 225 can never be the same because the negation ensures opposite logical values. Synchronous address latching circuitry 470 is symmetric in that respect, but it is also asymmetric because multiplexers 230 and 235 operate off of opposite polarities.

Multi-bit bypass multiplexers 250 and 255 are controlled by the PATH SELECT signal. When signal PATH SELECT indicates that the synchronous address latching mode is being used, bypass 250 steers the outputs from even slave latches 240 to the address decode circuitry for the even memory bank and bypass 255 steers the outputs from odd slave latches 245 to the address decode circuitry for the odd memory bank. If, however, signal PATH SELECT indicates that the synchronous address latching mode is not being used, bypass 250 steers the external address directly to the address decode circuitry for the even memory bank and bypass 255 steers external address directly to the address decode circuitry for the odd memory bank. Thus, when synchronous address latching mode is not being used, bypass multiplexers 250 and 255 effectively remove the rest of the components of address latching circuitry 470 (and any delay that they would cause) from the address path to the memory banks.

Synchronous address latching circuitry 470 can be extended to cover more than two banks. For example, for an embodiment wherein there are four banks, the bank address signal BANK ADDR would be expanded to be a two bit signal. There would be four pairs of master/slave latches so that there would be one pair of master/slave latches for each bank. Each pair of master/slave latches would have its own input multiplexer. The input multiplexer would select between the external address and the feedback from the slave latches under control from a three input AND gate decoder for the associated bank.

Thus, there would be four three input AND gate decoders. One input to each AND gate decoder would be the complement of address strobe signal ADS#. The other two inputs for each AND gate decoder would be the two bits of the bank address signal. For one of the AND gate decoders, both bits of signal BANK ADDR would be provided unchanged as input to the decoder. For the second of the AND gate decoders, both bits of signal BANK ADDR would be complemented before being provided as input to the decoder. For the third of the AND gate decoders, only the high order bit of signal BANK ADDR would be complemented before being provided as input to the decoder and the low order bit would be provided unchanged. For the fourth of the AND gate decoders, only the low order bit of signal BANK ADDR would be complemented before being provided as input to the decoder and the high order bit would be provided unchanged.

The timing diagram of FIG. 3 also illustrates the operation of the synchronous address latching circuitry of FIG. 4. Note that the synchronous address latching circuitry 470 of FIG. 4 has fewer components than the synchronous address latching circuitry of FIG. 2 and hence can be implemented in a smaller area on an integrated circuit. This is because adding a second set of master latches to circuitry 470 has eliminated the two sets of feedback latches of circuitry 170.

Furthermore, there is a better phase match in circuitry 470 than in circuitry 170. The outputs of AND gates 220 and 225 are signals that are synchronized with PH1 and are used to control selection multiplexers 230 and 235, respectively. In circuitry 170, the output from multiplexers 230 and 235 are inputs to slave latches 260 and 265, respectively. Slave latches 260 and 265 are both clocked by PH2. In circuitry 470, on the other hand, the output from multiplexers 230 and 235 are inputs to master latches 410 and 415, respectively. Master latches 410 and 415 are both clocked by PH1.

Figure 5:
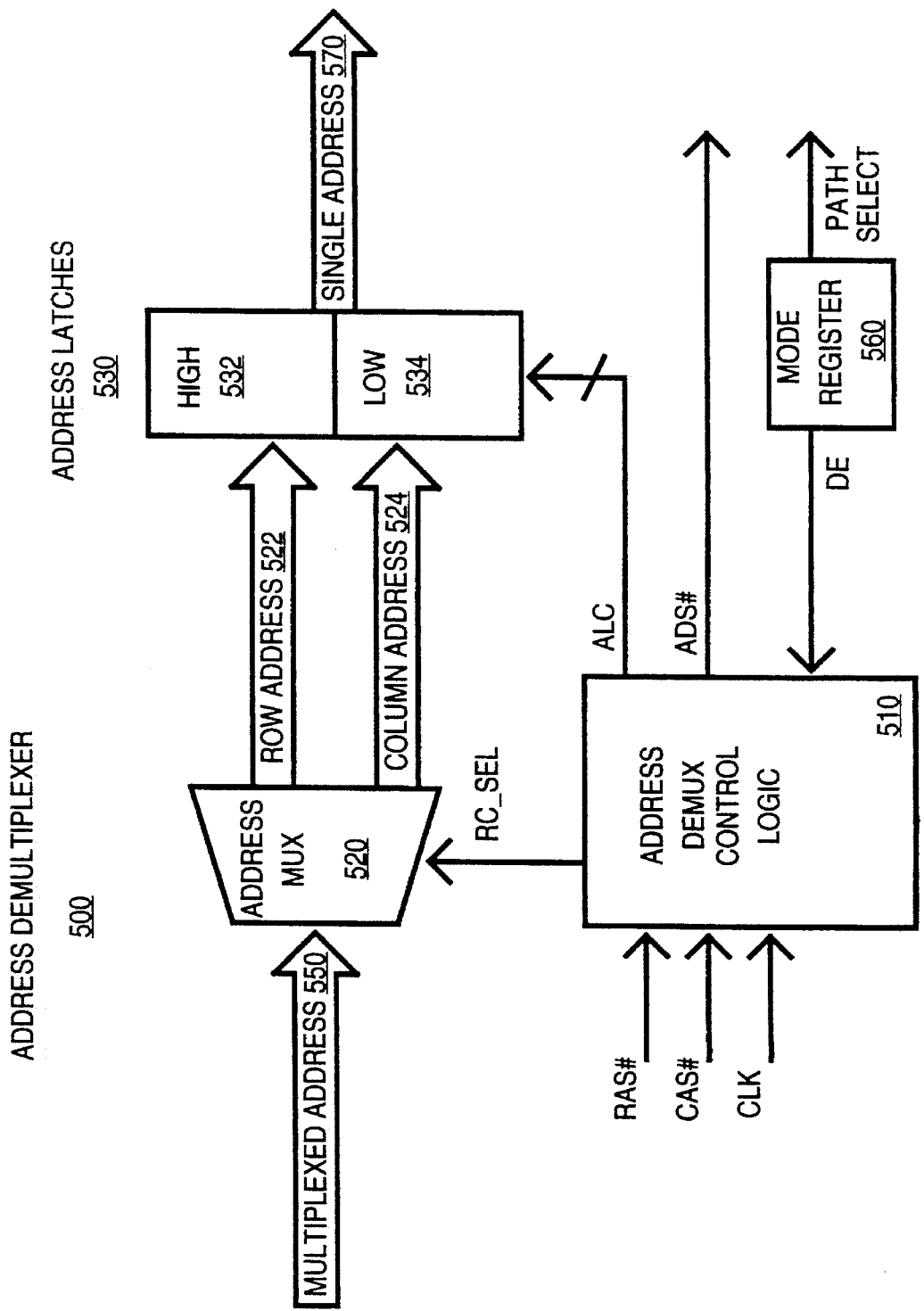
FIG. 5 illustrates a front-end address demultiplexer circuit for the synchronous address latching circuitry.

In the previous discussion, each external address specified to the memory has been a single monolithic address. Alternately, the external address can be specified as more than one parts of a single address that are multiplexed onto shared address lines. An example of this type of addressing occurs when dynamic random access memory (DRAM) is accessed synchronously. In such a case, a row address is provided on a set of address lines along with a row address strobe (RAS#) signal to indicate that the row address is being provided. Then, a column address is provided on the same address lines and a column address strobe (CAS#) signal is provided to indicate that the column address is being provided. FIG. 5 illustrates a front-end address demultiplexer circuit for the synchronous address latching circuitry that permits the synchronous address latching circuitry to work with multiplexed addresses.

In FIG. 5, multi-bit address latch 530 has been divided into two portions, high latches 532 and low latches 534. Multi-bit address latch control signal ALC is output from address demultiplexing (demux) control logic 510. Signal ALC permits logic 510 to individually control the high 532 and low 534 portions of address latches 530. Signal RC_SEL is also output from control logic 510 and permits control logic 510 to control the steering of multi-bit address mux 520.

Multiplexed addresses 550 enter address mux 520. The row addresses 522 of multiplexed addresses 550 are steered by address mux 520 into the high portion 532 of address latch 530. The column addresses 524 of multiplexed addresses 550 are steered by address mux 520 into the low portion 534 of address latch 530. Once a row and column address have been combined in address latch 530, they are released from latch 530 as a single address 570 that can be provided as the single external address to master latch 210 of synchronous address latching circuitry 170. Alternately, address latch 530 can replace master latch 210.

Signals RAS#, CAS# and CLK are provided as input to address demux control logic 510. When signal RAS# indicates that multiplexed address 550 is providing a row address, control logic 510 sets signal RC_SEL to cause address mux 520 to steer the row address into high portion 532 of address latch 530 and signal ALC causes the row address to be latched there. Then, when signal CAS# indicates that multiplexed address 550 is providing a column address, control logic 510 sets signal RC_SEL to cause address mux 520 to steer the column address into low portion 534 of address latch 530 and signal ALC causes the column address to be latched there. After a valid row and column address pair have been stored in address latch 530, a clock pulse from signal CLK will cause control logic 510 to signal address latch 530 to release single address 570. Control logic 510 will also generate an address strobe signal ADS# along with the single address 570 to indicate that single address 570 is a valid address.

Mode register 560 stores a multi-bit mode value that indicates the mode of operation of the memory device. One component stored in mode register 560 is a value that indicates the PATH SELECT setting. As discussed earlier, PATH SELECT determines whether the synchronous functionality of the address latching circuitry is to be used or not. Similarly, the value of demultiplexing enable signal DE is provided to control logic 510 and determines whether demultiplexing of external addresses is required or not.

In the foregoing specification the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than restrictive sense.

What is claimed is:

1. Synchronous address latching circuitry for a memory device having at least first and second banks of memory arrays, said latching circuitry comprising:

a first master latch to receive and store an external address if the external address belongs to the first bank;

a first slave latch to receive and store the external address from the first master latch and to provide a first slave output address, if the external address belongs to the first bank, the first slave latch to provide the external address to the first bank as the first slave output address;

a first input multiplexer to receive the external address and to receive the first slave output address from the first slave latch, if the external address belongs to the first bank,-the first input multiplexer to provide the external address to the first master latch, if the external address does not belong to the first bank, the first input multiplexer to provide the first slave output address to the first master latch;

a second master latch to receive and store the external address if the external address belongs to the second bank;

a second slave latch to receive and store the external address from the second master latch and to provide a second slave output address, if the external address belongs to the second bank, the second slave latch to provide the external address to the second bank as the second slave output address; and a second input multiplexer to receive the external address and to receive the second slave output address from the second slave latch, if the external address belongs to the second bank, the second input multiplexer to provide the external address to the second master latch, if the external address does not belong to the second bank, the second input multiplexer to provide the second slave output address to the second master latch.

2. The latching circuitry as set forth in claim 1, wherein the first and second master latches operate under the control of a first phased clock signal and wherein the first and second slave latches operate under the control of a second phased clock signal.

3. The latching circuitry as set forth in claim 1, wherein a bank address is formed from at least one bit of the external address and is provided to the first input multiplexer to control whether the first input multiplexer provides the external address to the first master latch or whether the first input multiplexer,provides the first slave output address from the first slave latch to the first master latch.

4. The latching circuitry as set forth in claim 1, wherein the external address is provided with an address strobe signal and wherein a bank address is formed from at least one bit of the external address, said latching circuitry further comprising:

a first AND gate, the bank address and the address strobe signals being provided as inputs to the first AND gate with output from the first AND gate being provided to the first input multiplexer to control whether the first input multiplexer provides the external address to the first master latch or whether the first input multiplexer provides the first slave output address from the first slave latch to the first master latch.

5. The latching circuitry as set forth in claim 1, wherein a bank address is formed from at least one bit of the external address and is provided to the first input multiplexer to control whether the first input multiplexer provides the external address to the first master latch or whether the first input multiplexer provides the first slave output address from the first slave latch to the first master latch and is also provided to the second input multiplexer to control whether the second input multiplexer provides the external address as to the second master latch or whether the second input multiplexer provides the second slave output address from the second slave latch to the second master latch.

6. The latching circuitry as set forth in claim 1, wherein the external address is provided with an address strobe signal and wherein a bank address signal is formed from at least one bit of the first address, said latching circuitry further comprising:

a first AND gate, the address strobe and the bank address signals being provided as inputs to the first AND gate with output from the first AND gate being provided to the first input multiplexer to control whether the first input multiplexer provides the external address to the first master latch or whether the first input multiplexer provides the first slave output address from the first slave latch to the first master latch; and a second AND gate, the address strobe signal and a complement of the bank address signal being provided as inputs to the second AND gate with output from the second AND gate being provided to the second input multiplexer to control whether the second input multiplexer provides the external address to the second master latch or whether the second input multiplexer provides the second slave output address from the second slave latch to the second master latch.

7. The latching circuitry as set forth in claim 1, further comprising:

a first bypass multiplexer coupled between the first slave latch and the first bank, the first bypass multiplexer receiving as inputs a path select control signal, the first slave output address from the first slave latch and the external address, if the path select control signal indicates synchronous mode, the first bypass multiplexer providing the first slave output address to the first bank and if the path select control signal does not indicate the synchronous mode, the first bypass multiplexer providing the external address to the first bank.

8. The latching circuitry as set forth in claim 7, further comprising:

a second bypass multiplexer coupled between the second slave latch and the second bank, the second bypass multiplexer receiving as inputs the path select control signal, the second slave output address from the second slave latch and the external address, if the path select control signal indicates the synchronous mode, the second bypass multiplexer providing the second slave output address to the second bank and if the path select signal does not indicate the synchronous mode, the second bypass multiplexer providing the external address to the second bank.

9. The latching circuitry as set forth in claim 1, further comprising address demultiplexing circuitry to receive a predetermined number of multiplexed addresses and convert the predetermined number of multiplexed addresses into the an external address.

10. The latching circuitry as set forth in claim 9, wherein the predetermined number of multiplexed addresses is two, wherein a first multiplexed address is provided to the address demultiplexing circuitry with a first address strobe signal and wherein a second multiplexed address is provided to the address demultiplexing circuitry with a second multiplexed address strobe signal.

11. The latching circuitry as set forth in claim 10, wherein the address demultiplexing circuitry comprises:

a first multiplexed address latch to receive and store the first multiplexed address;

a second multiplexed address latch to receive and store the second multiplexed address;

an address multiplexer to receive the predetermined number of multiplexed addresses, to provide the first multiplexed address to the first multiplexed address latch, and to provide the second multiplexed address to the second multiplexed address latch; and demultiplexer control circuitry to control operation of the address multiplexer and the first and second multiplexed address latches, if the demultiplexer circuitry receives the first address strobe, the demultiplexer circuitry causing the address multiplexer to provide the first multiplexed address to the first multiplexed address latch, if the demultiplexer circuitry receives the second address strobe, the demultiplexer circuitry causing the address multiplexer to provide the second multiplexed address to the second multiplexed address latch, if the first multiplexed address latch is storing the first multiplexed address and the second multiplexed address latch is storing a second multiplexed address corresponding to the first multiplexed address, the demultiplexer control circuitry causing the first multiplexed address latch to provide the first multiplexed address and the second multiplexed address latch to provide the second multiplexed address together as the external address.

12. A method for synchronously latching addresses for a memory device having at least first and second banks of memory arrays, said method comprising the steps of:

receiving an external address and output from a first slave latch as inputs to a first multiplexer;

the first input multiplexer providing as output a first address to a first master latch, if the external address belongs to the first bank, the first address being the external address, if the external address does not belong to the first bank, the first address being the output of the first slave latch;

the first master latch receiving and storing the first address;

the first slave latch receiving and storing the first address from the first master latch and providing the first address to the first bank and to the first input multiplexer;

receiving the external address and output from a second slave latch as inputs to a second multiplexer;

the second input multiplexer providing as output a second address to a second master latch, if the external address belongs to the second bank, the second address being the external address, if the external address does not belong to the second bank, the second address being the output of the second slave latch;

the second master latch receiving and storing the second address;

the second slave latch receiving and storing the second address from the second master latch and providing the second address to the second bank and to the second input multiplexer.

13. The method as set forth in claim 12, further comprising the steps of:

controlling the first, and second master latches with a first phased clock signal; and controlling the first and second slave latches with a second phased clock signal.

14. The method as set forth in claim 12, further comprising the steps of:

forming a bank address from at least one bit of the external address; and providing the bank address to the first input multiplexer to control whether the first input multiplexer provides the external address to the first master latch or whether the first input multiplexer provides the output from the first slave latch to the first master latch.

15. The method as set forth in claim 12, further comprising the steps of:

providing an address strobe signal with the external address;

forming a bank address from at least one bit of the external address;

providing the bank address and the address strobe signals as inputs to a first AND gate; and providing the output from the first AND gate to the first input multiplexer to control whether the first input multiplexer provides the external address to the first master latch or whether the first input multiplexer provides the output from the first slave latch to the first master latch.

16. The method as set forth in claim 12, further comprising the steps of:

forming a bank address from at least one bit of the external address;

providing the bank address to the first input multiplexer to control whether the first input multiplexer provides the external address to the first master latch or whether the first input multiplexer provides the output from the first slave latch to the first master latch; and providing the bank address to the second input multiplexer to control whether the second input multiplexer provides the external address to the second master latch or whether the second input multiplexer provides the output from the second slave latch to the second master latch.

17. The method as set forth in claim 12, further comprising the steps of:

providing an address strobe signal with the external address;

forming a bank address from at least one bit of the external address;

providing the bank address and the address strobe signals as inputs to a first AND gate;

providing the output from the first AND gate to the first input multiplexer to control whether the first input multiplexer provides the external address to the first master latch or whether the first input multiplexer provides the output from the first slave latch to the first master latch;

complementing the bank address signal;

providing address strobe signal and the complement of the bank address signal as inputs to a second AND gate; and providing the output from the second AND gate to the second input multiplexer to control whether the second input multiplexer provides the external address to the second master latch or whether the second input multiplexer provides the output from the second slave latch to the second master latch.

18. The method as set forth in claim 12, further comprising the steps of:

receiving a path select control signal, the first address output from the first slave latch and the external address as inputs to a first bypass multiplexer coupled between the first slave latch and the first bank;

if the path select signal indicates synchronous mode, the first bypass multiplexer providing the first address to the first bank; and if the path select signal does not indicate synchronous mode, the first bypass multiplexer providing the external address to the first bank.

19. The method as set forth in claim 18, further comprising the steps of:

receiving the path select control signal, the second address output from the second slave latch and the external address as inputs to a second bypass multiplexer coupled between the second slave latch and the second bank;

if the path select signal indicates synchronous mode, the second bypass multiplexer providing the second address to the second bank; and if the path select signal does not indicate synchronous mode, the second bypass multiplexer providing the external address to the second bank.

20. The method as set forth in claim 12, further comprising the steps of:

receiving a predetermined number of multiplexed addresses in address demultiplexing circuitry; and the address demultiplexing circuitry converting the predetermined number of multiplexed addresses into an external address to be provided to the first and second input multiplexers.

21. The method as set forth in claim 20, wherein the predetermined number of multiplexed addresses is two, further comprising the steps of:

providing a first multiplexed address to the address demultiplexing circuitry with a first address strobe signal; and providing a second multiplexed address to the address demultiplexing circuitry with a second address strobe signal.

22. The method as set forth in claim 21, further comprising the steps of:

receiving and storing the first multiplexed address in a first multiplexed address latch;

receiving and storing the second multiplexed address in a second multiplexed address latch;

receive the predetermined number of multiplexed addresses in an address multiplexer;

if the demultiplexer circuitry receives the first address strobe, the demultiplexer circuitry causing the address multiplexer to provide the first multiplexed address to the first multiplexed address latch;

if the demultiplexer circuitry receives the second address strobe, the demultiplexer circuitry causing the address multiplexer to provide the second multiplexed address to the second multiplexed address latch; and if the first multiplexed address latch is storing a first multiplexed address and the second multiplexed address latch is storing a second multiplexed address corresponding to the first multiplexed address, the demultiplexer control circuitry causing the first multiplexed address latch to provide the first multiplexed address and the second multiplexed address latch to provide the second multiplexed address together as the external address.

* * * * *

UNITED STATES PATENT AND TRADEMARK OFFICE
CERTIFICATE OF CORRECTION

PATENT NO. : 5,497,355
DATED : March 5, 1996
INVENTOR(S) : Mills et al.

It is certified that error appears in the above-identified patent and that said Letters Patent is hereby corrected as shown below:

In column 7 at line 44 delete "docked" and insert --clocked--

In column 13 at line 63 delete "bank,-the" and insert --bank, the--

In column 14 at line 28 delete "multiplexer,provides" and insert --multiplexer provides--

Signed and Sealed this

Fifteenth Day of October, 1996

*Attest:*

BRUCE LEHMAN

*Attesting Officer*     Commissioner of Patents and Trademarks